United States Patent
Khellah et al.

(10) Patent No.: US 7,230,842 B2
(45) Date of Patent: Jun. 12, 2007

(54) MEMORY CELL HAVING P-TYPE PASS DEVICE

(75) Inventors: Muhammad M. Khellah, Tigard, OR (US); Dinesh Somasekhar, Portland, OR (US); Nam Sung Kim, Hillsboro, OR (US); Yibin Ye, Portland, OR (US); Vivek K. De, Beaverton, OR (US); Kevin Zhang, Portland, OR (US); Bo Zheng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 11/225,912

(22) Filed: Sep. 13, 2005

(65) Prior Publication Data

US 2007/0058419 A1    Mar. 15, 2007

(51) Int. Cl.
    *G11C 11/00* (2006.01)
(52) U.S. Cl. ............... 365/154; 365/156; 365/204; 257/903
(58) Field of Classification Search ........ 365/154, 365/156; 257/204, 903
    See application file for complete search history.

(56) References Cited

U.S. PATENT DOCUMENTS

| | | | |
|---|---|---|---|
| 5,754,467 A * | 5/1998 | Ikeda et al. ............... | 365/154 |
| 6,181,608 B1 | 1/2001 | Keshavarzi et al. | |
| 6,198,656 B1 | 3/2001 | Zhang | |
| 6,519,176 B1 | 2/2003 | Hamzaoglu et al. | |
| 6,522,562 B2 * | 2/2003 | Foss ............................. | 365/49 |
| 6,621,726 B2 | 9/2003 | Zhang et al. | |
| 6,724,648 B2 | 4/2004 | Khellah et al. | |
| 6,724,649 B1 | 4/2004 | Ye et al. | |
| 6,775,181 B2 | 8/2004 | Zhang et al. | |
| 6,831,871 B2 | 12/2004 | Khellah et al. | |
| 6,862,207 B2 | 3/2005 | Wei et al. | |
| 6,876,571 B1 | 4/2005 | Khellah et al. | |
| 6,909,652 B2 | 6/2005 | Ye et al. | |
| 6,970,373 B2 | 11/2005 | Datta et al. | |
| 6,985,380 B2 | 1/2006 | Khellah et al. | |
| 2003/0090927 A1 | 5/2003 | Zhang et al. | |
| 2003/0189849 A1 | 10/2003 | Khellah et al. | |
| 2004/0071010 A1 | 4/2004 | Wei et al. | |
| 2004/0095811 A1 | 5/2004 | Zhang et al. | |
| 2004/0100815 A1 | 5/2004 | Ye et al. | |

(Continued)

OTHER PUBLICATIONS

Bhavnagarwala, Azeez J., et al., "The Impact Of Intrinsic Device Fluctuations On CMOS SRAM Cell Stability", IEEE Journal of Solid-State Circuits, vol. 36, No. 4, pp. 658-665 (Apr. 2001).

(Continued)

*Primary Examiner*—Huan Hoang
(74) *Attorney, Agent, or Firm*—Erik R. Nordstrom

(57) ABSTRACT

For one disclosed embodiment, an apparatus comprises a first p-type device coupled between a cell voltage node and a storage node, an n-type device coupled between the storage node and a reference voltage node, and a second p-type device to couple the storage node to a bit line in response to a signal on a select line. At least one side of diffusion regions in a substrate to form both the first p-type device and the second p-type device are substantially aligned. Other embodiments are also disclosed.

20 Claims, 7 Drawing Sheets

U.S. PATENT DOCUMENTS

| | | |
|---|---|---|
| 2004/0125677 A1 | 7/2004 | Khellah et al. |
| 2005/0073060 A1 | 4/2005 | Datta et al. |
| 2005/0135162 A1 | 6/2005 | Somasekhar et al. |
| 2005/0157537 A1 | 7/2005 | Wei et al. |
| 2005/0213370 A1 | 9/2005 | Khellah et al. |
| 2005/0226032 A1 | 10/2005 | Tang et al. |
| 2005/0237850 A1 | 10/2005 | Datta et al. |
| 2006/0002177 A1 | 1/2006 | Zhang et al. |

OTHER PUBLICATIONS

Noda, Kenji, et al., "An Ultrahigh-Density High-Speed Loadless Four-Transistor SRAM Macro With Twisted Bitline Architecture And Triple-Well Shield", IEEE Journal of Solid-State Circuits, vol. 36, No. 3, pp. 510-515 (Mar. 2001).

Okamura, Hitoshi, et al., "A 1 ns, 1 W, 2.5 V, 32 Kb NTL-CMOS SRAM Macro Using A Memory Cell With PMOS Access Transistors", IEEE Journal of Solid-State Circuits, vol. 30, No. 11, pp. 1196-1202 (Nov. 1995).

Yamaoka, Masanao, et al., "0.4-V Logic-Library-Friendly SRAM Array Using Rectangular-Diffusion Cell and Delta-Boosted-Array Voltage Scheme", IEEE Journal of Solid-State Circuits, vol. 39, No. 6, pp. 934-940 (Jun. 2004).

* cited by examiner

MEMORY CELL HAVING P-TYPE PASS DEVICE

FIELD

Embodiments described herein generally relate to memory.

BACKGROUND

FIG. 1 illustrates a circuit diagram for a prior art six transistor (6T) memory cell 1 for a static random access memory (SRAM). As illustrated in FIG. 1, memory cell 1 has two cross-coupled inverters 10 and 20 coupled between a supply voltage Vcc node and a ground node to generate complementary signals at storage nodes 11 and 21. Inverter 10 has a pull-up p-channel field effect transistor (PFET) 12 and a pull-down n-channel FET (NFET) 14. The gates of PFET 12 and NFET 14 are both coupled to receive a signal at storage node 21 to generate an inverted signal at storage node 11. Similarly, inverter 20 has a pull-up PFET 22 and a pull-down NFET 24. The gates of PFET 22 and NFET 24 are both coupled to receive a signal at storage node 11 to generate an inverted signal at storage node 21. The complementary signals at storage nodes 11 and 21 represent a single binary value depending on which signal is at which storage node 11 or 21.

Memory cell 1 also has NFETs 16 and 26 to access memory cell 1 to read a binary value from and/or write a binary value to memory cell 1. The gate of NFET 16 is coupled to receive a signal on a word line 30 to couple storage node 11 to a bit line 31. The gate of NFET 26 is coupled to receive a signal on word line 30 to couple storage node 21 to a bit line 32. Memory cell 1 may then be accessed by sensing the complementary signals on bit lines 31 and 32 to read the binary value stored by memory cell 1 or by asserting complementary signals on bit lines 31 and 32 to write a binary value to memory cell 1. NFETs 16 and 26 are known as transfer, access, or pass transistors.

To speed reading the binary value, PFETs 41, 42, and 43 are activated in response to a signal on a precharge line 40 to precharge bit lines 31 and 32 by coupling them to a supply voltage Vcc node. The binary value may then be read as soon as bit line 31 is pulled down by NFET pair 14 and 16 or bit line 32 is pulled down by NFET pair 24 and 26 without having to wait for the other bit line 32 or 31 to be pulled up.

Memory cell 1 is to be designed to meet a minimum level of stability for a given memory size and process. Read stability can be loosely defined as the probability that memory cell 1 will flip its stored binary value during a read operation. Memory cell 1 is more susceptible to noise during a read operation because the voltage at the low storage node, such as storage node 21 for example, will rise due to the voltage division by NFETs 24 and 26 between precharged bit line 32 and the ground node when NFET 26 is activated by a high signal on word line 30. Mismatch in threshold voltage Vth of neighboring transistors, such as NFETs 24 and 26 for example, reduces the available static noise margin (SNM) of memory cell 1 and therefore reduces read stability of memory cell 1. As transistor dimensions are scaled, variability in the number and location of channel dopant atoms can result in restrictive electrical deviations in transistor threshold voltages Vth.

One technique to reduce noise at storage node 21, for example, and therefore help increase read stability of memory cell 1, is to increase the ratio of the transconductance of NFET 24 relative to that of NFET 26. This ratio is known as the cell ratio. A cell ratio of 1.5 to 2.0 is typical. The cell ratio in this example may be increased, for example, by sizing NFET 24 to have a larger width than NFET 26. The cell ratio in this example may also be increased, for example, by boosting the supply voltage for the cross-coupled inverters relative to the voltage supplied to precharge bit lines 31 and 32.

Because a write is performed by discharging the voltage at the high storage node, such as storage node 21 for example, through NFET 26, write stability is proportional to the ratio of the transconductance of NFET 26 relative to that of PFET 22. This value is typically larger than 2.0.

The stability of memory cell 1 is also impacted by diffusion bends in the layout of memory cell 1. FIG. 2 illustrates a prior art integrated circuit layout for memory cell 1. As illustrated in FIG. 2, an n-type diffusion region 15 is shared by NFETs 14 and 16, and an n-type diffusion region 25 is shared by NFETs 24 and 26. The bends in diffusion regions 15 and 25 are susceptible to manufacturing misalignment defects which can lead to unequal shifts in the diffusion widths of NFETs 14, 16, 24, and 26. Memory cell 1 is thus more susceptible to transistor threshold voltage Vth mismatch because the fabricated diffusion widths may be different than intended.

BRIEF DESCRIPTION OF THE DRAWINGS

Embodiments are illustrated by way of example and not limitation in the figures of the accompanying drawings, in which like references indicate similar elements and in which.

The figures of the drawings are not necessarily drawn to scale.

DETAILED DESCRIPTION

The following detailed description sets forth example embodiments of methods, apparatuses, and systems relating to a memory cell having a p-type pass device. Features, such as structure(s), function(s), and/or characteristic(s) for example, are described with reference to one embodiment as a matter of convenience; various embodiments may be implemented with any suitable one or more described features.

A memory cell has a p-type pass device to help provide access to the memory cell. The memory cell for one embodiment may optionally be designed with a p-type pass device to help fabricate the memory cell with at least a minimum desired stability. The memory cell for one embodiment may optionally be designed with a p-type pass device to allow both the p-type pass device and another p-type device of the memory cell to be formed using substantially aligned diffusion regions in a substrate. Designing the memory cell in this manner for one embodiment may help reduce or eliminate diffusion bends in the layout of the memory cell, helping to make the memory cell less susceptible to shifting due to manufacturing misalignment defects.

Memory Cell

Figure 1:
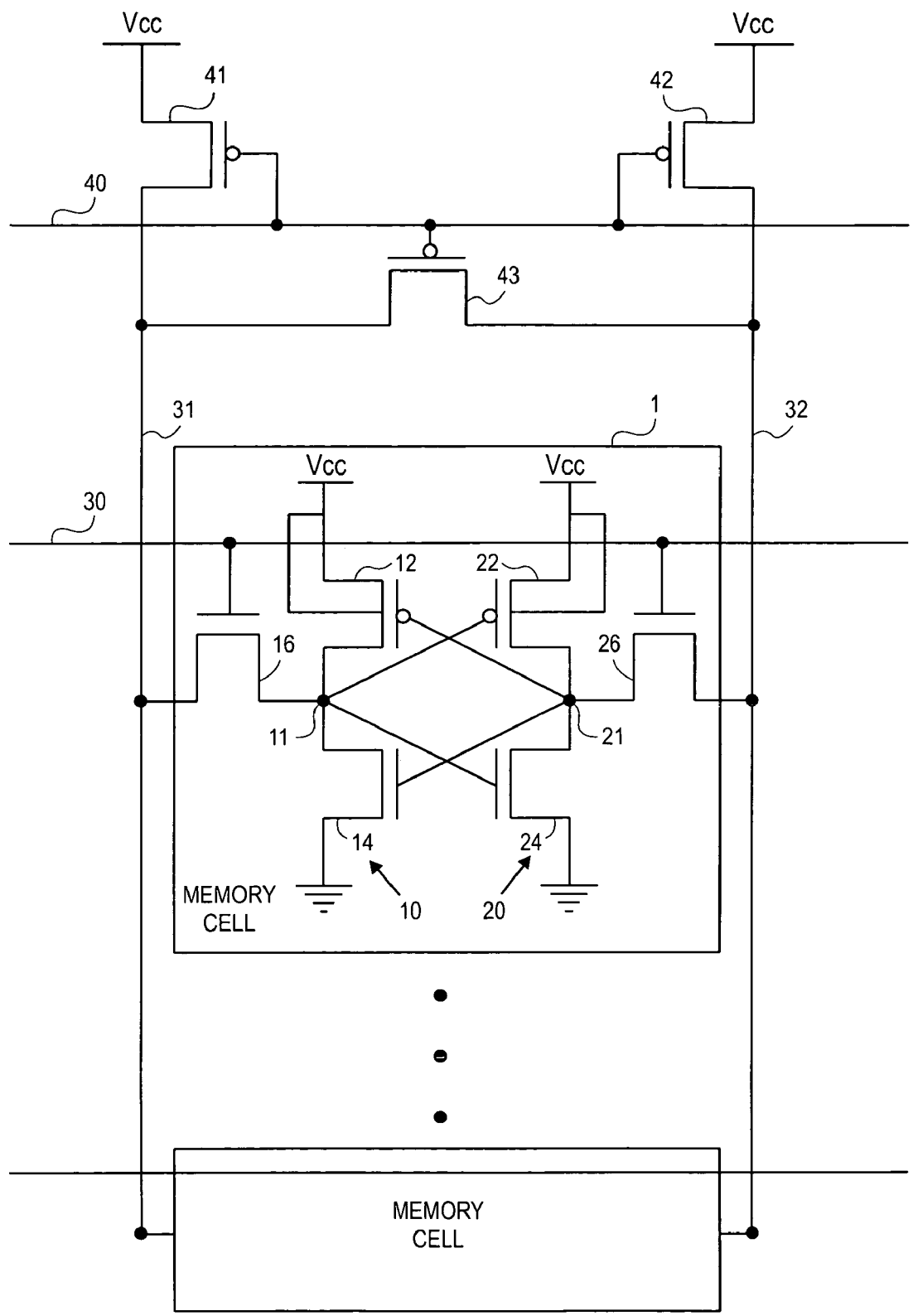
FIG. 1 illustrates a circuit diagram for a prior art six transistor (6T) memory cell for a static random access memory (SRAM)
Figure 2:
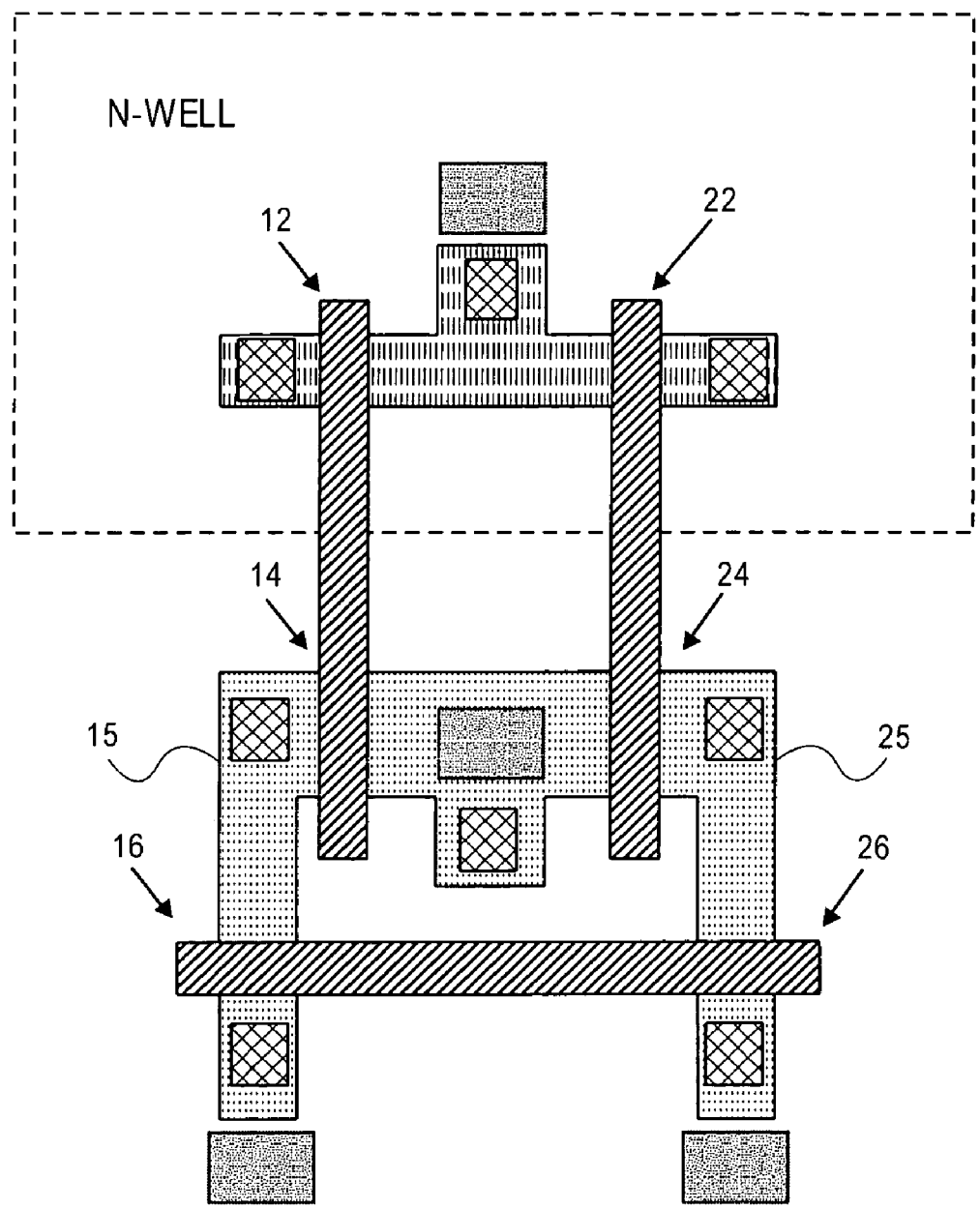
FIG. 2 illustrates a prior art integrated circuit layout for the memory cell of FIG. 1.
Figure 3:
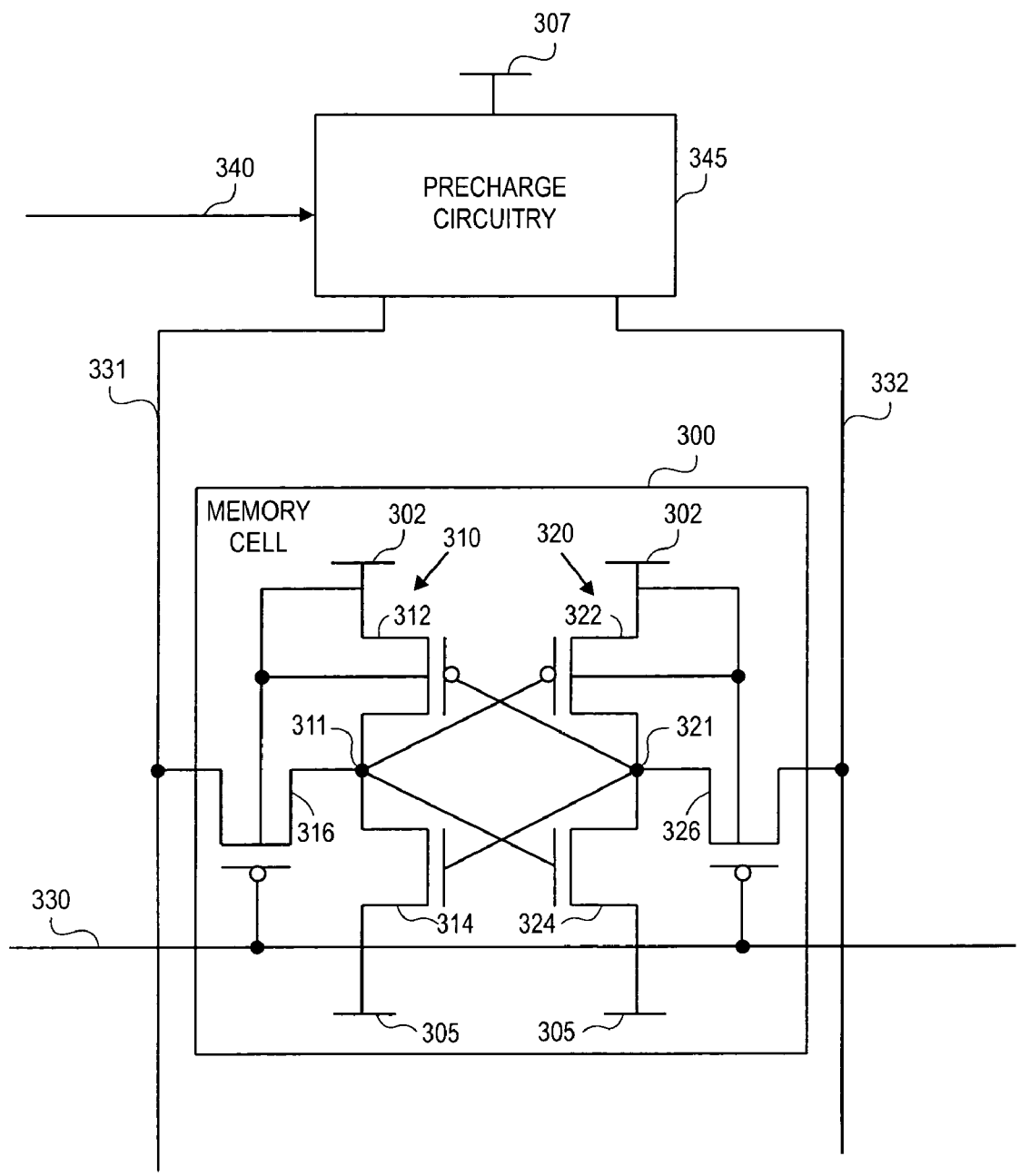
FIG. 3 illustrates, for one embodiment, a circuit diagram for a memory cell having a p-type pass device.

FIG. 3 illustrates, for one embodiment, a circuit diagram for a memory cell 300 having a p-type pass device, such as a p-type device 316 or 326 for example, to help provide access to memory cell 300.

Memory cell 300 for one embodiment may comprise a p-type device 312, an n-type device 314, and p-type device 316.

P-type device 312 for one embodiment may be coupled between a cell voltage node 302 and a storage node 311. N-type device 314 for one embodiment may be coupled between storage node 311 and a reference voltage node 305, such as a ground node for example. P-type device 312 and n-type device 314 for one embodiment may generate at storage node 311 a signal representative of a binary value stored by memory cell 300. P-type device 316 serves as a pass device to couple storage node 311 to a bit line 331. P-type device 316 may therefore help read a binary value stored by memory cell 300 by outputting the signal at storage node 311 onto bit line 331. P-type device 316 for one embodiment may couple storage node 311 to bit line 331 in response to a signal on a select line 330.

P-type device 312 and p-type device 316 for one embodiment may have substantially the same width. For one embodiment, at least one side of diffusion regions in a substrate to form both p-type device 312 and p-type device 316 may be substantially aligned. For one embodiment, one side along a length of diffusion regions in a substrate to form both p-type device 312 and p-type device 316 may be substantially aligned. For one embodiment, widths of diffusion regions in a substrate to form both p-type device 312 and p-type device 316 may be substantially aligned.

Memory cell 300 for one embodiment may also comprise a p-type device 322, an n-type device 324, and p-type device 326.

P-type device 322 for one embodiment may be coupled between cell voltage node 302 and a storage node 321. N-type device 324 for one embodiment may be coupled between storage node 321 and reference voltage node 305. P-type device 322 and n-type device 324 for one embodiment may generate at storage node 321 a signal representative of a binary value stored by memory cell 300. P-type device 326 serves as a pass device to couple storage node 321 to a bit line 332. P-type device 326 may therefore help read a binary value stored by memory cell 300 by outputting the signal at storage node 321 onto bit line 332. P-type device 326 for one embodiment may couple storage node 321 to bit line 332 in response to a signal on select line 330.

P-type device 322 and p-type device 326 for one embodiment may have substantially the same width. For one embodiment, at least one side of diffusion regions in a substrate to form both p-type device 322 and p-type device 326 may be substantially aligned. For one embodiment, one side along a length of diffusion regions in a substrate to form both p-type device 322 and p-type device 326 may be substantially aligned. For one embodiment, widths of diffusion regions in a substrate to form both p-type device 322 and p-type device 326 may be substantially aligned.

Memory cell 300 for one embodiment, as illustrated in FIG. 3, may implement an inverter 310 and an inverter 320 to generate signals at storage nodes 311 and 321. Inverters 310 and 320 for one embodiment may be powered using a supply voltage at cell voltage node 302.

Inverter 310 for one embodiment may output a signal at storage node 311 in response to a signal at storage node 321.

Inverter 310 for one embodiment may comprise p-type device 312 to couple or pull-up storage node 311 to cell voltage node 302 in response to a first signal at storage node 321. P-type device 312 for one embodiment, as illustrated in FIG. 3, may comprise a p-channel transistor having a gate coupled to storage node 321. The p-channel transistor for one embodiment may be activated in response to a relatively low voltage signal at storage node 321 to generate a relatively high voltage signal at storage node 311. The p-channel transistor for one embodiment may be a p-channel field effect transistor (PFET). The p-channel transistor for one embodiment may comprise a p-channel metal oxide semiconductor field effect transistor (P-MOSFET). The substrate for the p-channel transistor for one embodiment, as illustrated in FIG. 3, may be coupled to cell voltage node 302.

Inverter 310 for one embodiment may comprise n-type device 314 to couple or pull-down storage node 311 to reference voltage node 305 in response to a second signal at storage node 321. N-type device 314 for one embodiment, as illustrated in FIG. 3, may comprise an n-channel transistor having a gate coupled to storage node 321. The n-channel transistor for one embodiment may be activated in response to a relatively high voltage signal at storage node 321 to generate a relatively low voltage signal at storage node 311. The n-channel transistor for one embodiment may be an n-channel field effect transistor (NFET). The n-channel transistor for one embodiment may comprise an n-channel metal oxide semiconductor field effect transistor (N-MOSFET).

Inverter 320 for one embodiment may output a signal at storage node 321 in response to a signal at storage node 311.

Inverter 320 for one embodiment may comprise p-type device 322 to couple or pull-up storage node 321 to cell voltage node 302 in response to a first signal at storage node 311. P-type device 322 for one embodiment, as illustrated in FIG. 3, may comprise a p-channel transistor having a gate coupled to storage node 311. The p-channel transistor for one embodiment may be activated in response to a relatively low voltage signal at storage node 311 to generate a relatively high voltage signal at storage node 321. The p-channel transistor for one embodiment may be a p-channel field effect transistor (PFET). The p-channel transistor for one embodiment may comprise a p-channel metal oxide semiconductor field effect transistor (P-MOSFET). The substrate for the p-channel transistor for one embodiment, as illustrated in FIG. 3, may be coupled to cell voltage node 302.

Inverter 320 for one embodiment may comprise n-type device 324 to couple or pull-down storage node 321 to reference voltage node 305 in response to a second signal at storage node 311. N-type device 324 for one embodiment, as illustrated in FIG. 3, may comprise an n-channel transistor having a gate coupled to storage node 311. The n-channel transistor for one embodiment may be activated in response to a relatively high voltage signal at storage node 311 to generate a relatively low voltage signal at storage node 321. The n-channel transistor for one embodiment may be an n-channel field effect transistor (NFET). The n-channel transistor for one embodiment may comprise an n-channel metal oxide semiconductor field effect transistor (N-MOSFET).

Inverters 310 and 320 for one embodiment may generate complementary signals at storage nodes 311 and 321 to represent a single binary value depending on which signal is at which storage node 311 or 321. To read a binary value from memory cell 300 for one embodiment, both storage nodes 311 and 321 may be coupled to bit lines 331 and 332, respectively, by p-type devices 316 and 326, respectively, to allow the signals at storage nodes 311 and 321 to be identified or sensed.

P-type device 316 for one embodiment may be coupled between storage node 311 and bit line 331. P-type device 316 for one embodiment, as illustrated in FIG. 3, may comprise a p-channel transistor having a gate coupled to select line 330. The p-channel transistor for one embodiment may be activated in response to a relatively low voltage signal on select line 330 to couple storage node 311 to bit line 331. The p-channel transistor for one embodiment may be a p-channel field effect transistor (PFET). The p-channel transistor for one embodiment may comprise a p-channel metal oxide semiconductor field effect transistor (P-MOSFET). The substrate for the p-channel transistor for one embodiment, as illustrated in FIG. 3, may be coupled to cell voltage node 302.

P-type device 326 for one embodiment may be coupled between storage node 321 and bit line 332. P-type device 326 for one embodiment, as illustrated in FIG. 3, may comprise a p-channel transistor having a gate coupled to select line 330. The p-channel transistor for one embodiment may be activated in response to a relatively low voltage signal on select line 330 to couple storage node 321 to bit line 332. The p-channel transistor for one embodiment may be a p-channel field effect transistor (PFET). The p-channel transistor for one embodiment may comprise a p-channel metal oxide semiconductor field effect transistor (P-MOSFET). The substrate for the p-channel transistor for one embodiment, as illustrated in FIG. 3, may be coupled to cell voltage node 302.

Prior to coupling storage nodes 311 and 321 to bit lines 331 and 332, respectively, precharge circuitry 345 for one embodiment may be activated in response to one or more precharge signals, such as a precharge signal on a precharge line 340 for example, to precharge bit lines 331 and 332. Noting that storage nodes 311 and 321 may have complementary signals and that pulling-down one bit line 331 or 332 may be faster than pulling up the other bit line 332 or 331, precharging both bit lines 331 and 332 for one embodiment may help allow the signals at storage nodes 311 and 321 to be identified or sensed relatively faster when storage nodes 311 and 321 are coupled to bit lines 331 and 332, respectively. Precharge circuitry 345 may comprise any suitable circuitry.

Using a PFET or P-MOSFET for p-type devices 316 and 326 and an NFET or N-MOSFET for n-type devices 314 and 324 for one embodiment may help increase read stability of memory cell 300 because a PFET or P-MOSFET may have a smaller transconductance relative to an NFET or N-MOSFET of equal width mainly due to lower mobility.

P-type device 316 and n-type device 314 may have any suitable size to help realize any suitable ratio of transconductance for read stability of memory cell 300. For one embodiment where p-type device 316 comprises a p-channel transistor and n-type device 314 comprises an n-channel transistor, such transistors may have any suitable width to help realize any suitable ratio of transconductance for read stability of memory cell 300. The widths of such transistors may or may not be substantially the same.

P-type device 326 and n-type device 324 may have any suitable size to help realize any suitable ratio of transconductance for read stability of memory cell 300. For one embodiment where p-type device 326 comprises a p-channel transistor and n-type device 324 comprises an n-channel transistor, such transistors may have any suitable width to help realize any suitable ratio of transconductance for read stability of memory cell 300. The widths of such transistors may or may not be substantially the same.

For one embodiment where a suitable level of read stability of memory cell 300 is realized based on the size of p-type devices 316 and 326 and of n-type devices 314 and 324, bit lines 331 and 332 may be precharged using a supply voltage that is substantially the same as that used for inverters 310 and 320. Precharge circuitry 345 for one embodiment may be activated to couple bit lines 331 and 332 to a precharge voltage node 307 having a voltage that is substantially the same as that at cell voltage node 302 to pull-up a voltage signal on bit lines 331 and 332. Memory cell 300 for one embodiment may therefore be optionally designed without additional circuitry otherwise required to boost the supply voltage for inverters 310 and 320 relative to the voltage supplied to precharge bit lines 331 and 332.

To write a binary value to memory cell 300 for one embodiment, complementary signals may be asserted on bit lines 331 and 332 based on the binary value to be written, and bit lines 331 and 332 may then be coupled by p-type devices 316 and 326, respectively, to storage nodes 311 and 321, respectively. For one embodiment, bit lines 331 and 332 may be precharged to help speed the write operation.

P-type device 312 and p-type device 316 may have any suitable size to help realize any suitable ratio of transconductance for write stability of memory cell 300. For one embodiment where p-type device 312 comprises a p-channel transistor and p-type device 316 comprises a p-channel transistor, such transistors may have any suitable width to help realize any suitable ratio of transconductance for write stability of memory cell 300. The widths of such transistors may or may not be substantially the same.

P-type device 312 and p-type device 316 for one embodiment may comprise a P-MOSFET transistor having substantially the same width and a ratio of transconductance of substantially 1.0. Nevertheless, increasing the widths of both such transistors for one embodiment may help reduce or avoid transistor threshold voltage Vth mismatch, and therefore help increase write stability of memory cell 300. Increasing the widths of both such transistors for one embodiment may also help to write not only a weak relatively low voltage signal to the relatively high voltage storage node but also a relatively high voltage signal to the relatively low voltage storage node.

P-type device 322 and p-type device 326 may have any suitable size to help realize any suitable ratio of transconductance for write stability of memory cell 300. For one embodiment where p-type device 322 comprises a p-channel transistor and p-type device 326 comprises a p-channel transistor, such transistors may have any suitable width to help realize any suitable ratio of transconductance for write stability of memory cell 300. The widths of such transistors may or may not be substantially the same.

P-type device 322 and p-type device 326 for one embodiment may comprise a P-MOSFET transistor having substantially the same width and a ratio of transconductance of substantially 1.0. Nevertheless, increasing the widths of both such transistors for one embodiment may help reduce or avoid transistor threshold voltage Vth mismatch, and therefore help increase write stability of memory cell 300. Increasing the widths of both such transistors for one embodiment may also help to write not only a weak relatively low voltage signal to the relatively high voltage storage node but also a relatively high voltage signal to the relatively low voltage storage node.

P-type devices 312, 316, 322, and 326 and n-type devices 314 and 324 for one embodiment may be sized to help balance both read and write stabilities of memory cell 300.

Figure 4:
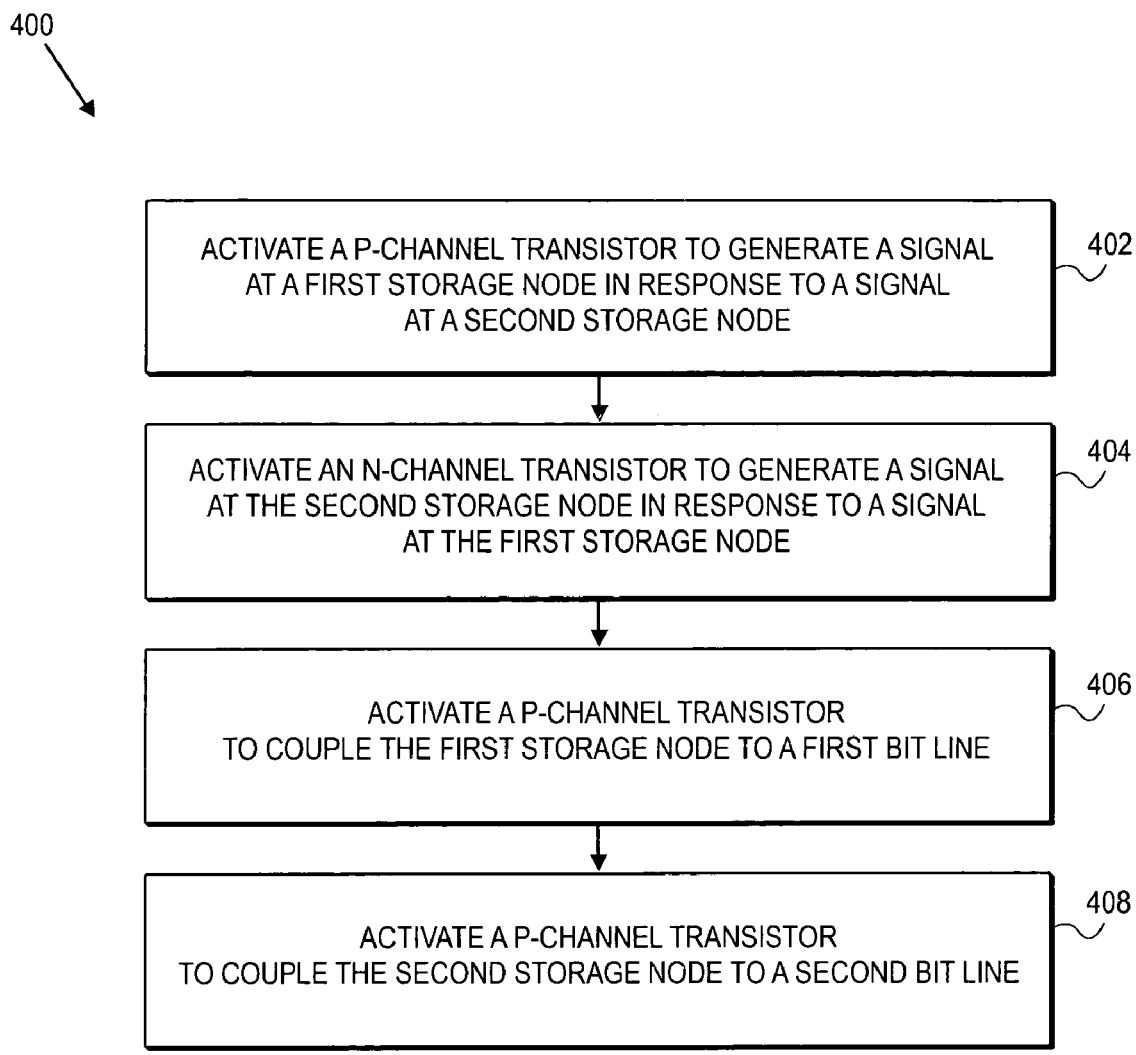
FIG. 4 illustrates, for one embodiment, a flow diagram to use a memory cell of FIG. 3.

FIG. 4 illustrates, for one embodiment, a flow diagram 400 to use memory cell 300.

For block 402 of FIG. 4, a p-channel transistor for p-type device 312, for example, may be activated to generate a signal at storage node 311 in response to a signal at storage node 321. For block 404, an n-channel transistor for n-type device 324 may be activated to generate a signal at storage node 321 in response to a signal at storage node 311. For block 406, a p-channel transistor for p-type device 316 may be activated to couple storage node 311 to bit line 331. For block 408, a p-channel transistor for p-type device 326 may be activated to couple storage node 321 to bit line 332.

Bit lines 331 and 332 for one embodiment may optionally be precharged using a supply voltage that is substantially the same as that to generate a signal at storage node 311 in response to activation of the p-channel transistor for p-type device 312.

Example Memory Cell Layout

Figure 5:
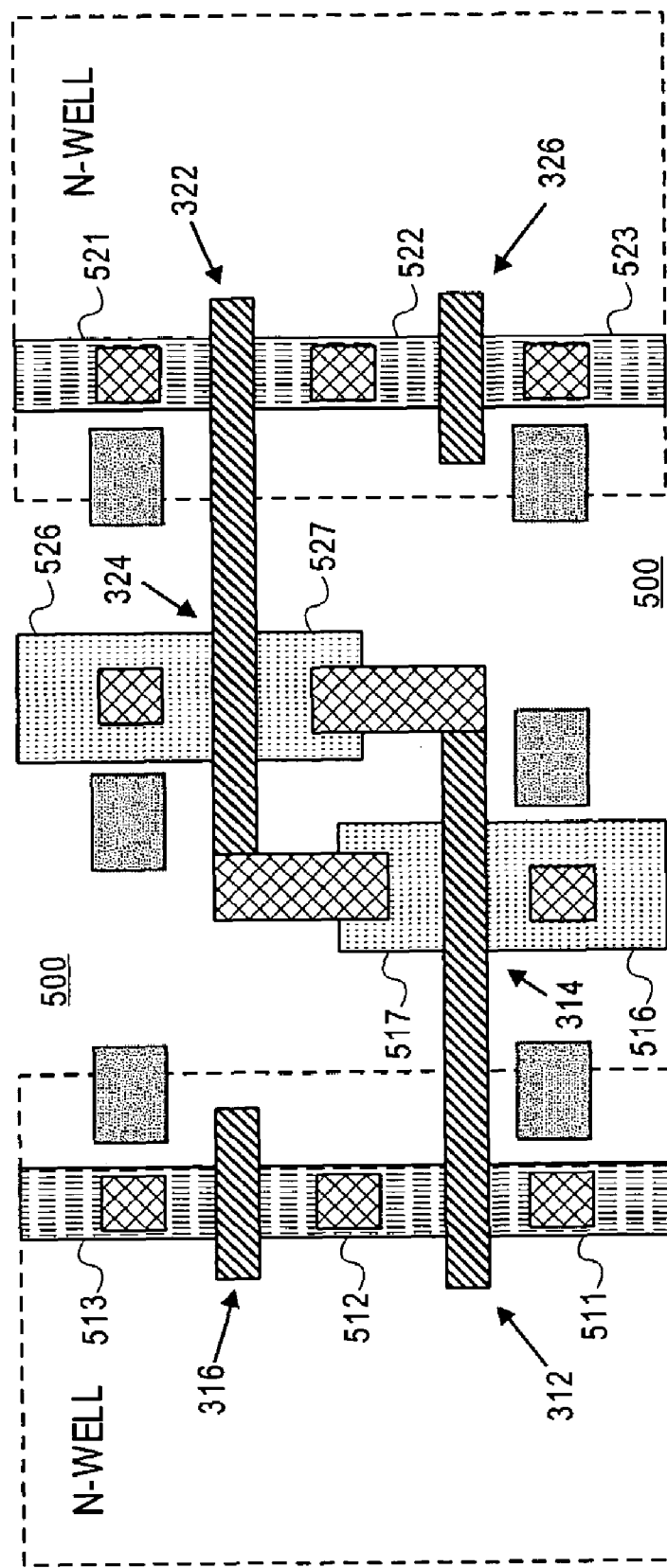
FIG. 5 illustrates, for one embodiment, an example integrated circuit layout for the circuit diagram of FIG. 3.

Memory cell 300 may be fabricated in accordance with any suitable integrated circuit layout. Memory cell 300 for one embodiment may be fabricated in accordance with the example integrated circuit layout illustrated in FIG. 5. In FIG. 5, reference numbers common to those of FIG. 3 identify corresponding features.

As illustrated in FIG. 5, both p-type device 312 and p-type device 316 for one embodiment may be implemented as p-channel transistors formed at least in part using substantially aligned p-type diffusion regions 511, 512, and 513 in a substrate 500, noting both transistors share p-type diffusion region 512. For one embodiment, p-type diffusion regions 511, 512, and 513 may be substantially aligned in a substantially straight manner. For one embodiment, one side of p-type diffusion regions 511, 512, and 513 may be substantially aligned with one another. For one embodiment, one side along the length of p-type diffusion regions 511, 512, and 513 may be substantially aligned with one another. For one embodiment, opposite sides of p-type diffusion regions 511, 512, and 513 may be substantially aligned with one another. For one embodiment where both transistors have substantially the same width, as illustrated in FIG. 5, both sides along the length of p-type diffusion regions 511, 512, and 513, that is the widths of p-type diffusion regions 511, 512, and 513, may be substantially aligned with one another. P-type diffusion regions 511, 512, and 513 for one embodiment may be substantially aligned to together form a generally rectangular shape.

Aligning diffusion regions in the layout for memory cell 300 for one embodiment may help reduce or eliminate diffusion bends in the layout of memory cell 300, helping to make memory cell 300 less susceptible to shifting due to manufacturing misalignment defects.

Aligning p-type diffusion regions 511, 512, and 513 for one embodiment may help fabricate transistors for p-type devices 312 and 316 with diffusion widths substantially as intended. Aligning p-type diffusion regions 511, 512, and 513 for one embodiment may therefore help fabricate transistors for p-type devices 312 and 316 with a ratio of transconductance substantially as intended.

N-type device 314 for one embodiment, as illustrated in FIG. 5, may be implemented as an n-channel transistor formed at least in part using substantially aligned n-type diffusion regions 516 and 517 in substrate 500. Transistors for p-type device 316 and n-type device 314 for one embodiment may therefore not have diffusion bends, helping to fabricate transistors for p-type device 316 and n-type device 314 with diffusion widths substantially as intended and therefore with a ratio of transconductance substantially as intended.

Both p-type device 322 and p-type device 326 for one embodiment may be implemented as p-channel transistors formed at least in part using substantially aligned p-type diffusion regions 521, 522, and 523 in a substrate 500, noting both transistors share p-type diffusion region 522. For one embodiment, p-type diffusion regions 521, 522, and 523 may be substantially aligned in a substantially straight manner. For one embodiment, one side of p-type diffusion regions 521, 522, and 523 may be substantially aligned with one another. For one embodiment, one side along the length of p-type diffusion regions 521, 522, and 523 may be substantially aligned with one another. For one embodiment, opposite sides of p-type diffusion regions 521, 522, and 523 may be substantially aligned with one another. For one embodiment where both transistors have substantially the same width, as illustrated in FIG. 5, both sides along the length of p-type diffusion regions 521, 522, and 523, that is the widths of p-type diffusion regions 521, 522, and 523, may be substantially aligned with one another. P-type diffusion regions 521, 522, and 523 for one embodiment may be substantially aligned to together form a generally rectangular shape.

Aligning p-type diffusion regions 521, 522, and 523 for one embodiment may help fabricate transistors for p-type devices 322 and 326 with diffusion widths substantially as intended. Aligning p-type diffusion regions 521, 522, and 523 for one embodiment may therefore help fabricate transistors for p-type devices 322 and 326 with a ratio of transconductance substantially as intended.

N-type device 324 for one embodiment, as illustrated in FIG. 5, may be implemented as an n-channel transistor formed at least in part using substantially aligned n-type diffusion regions 526 and 527 in substrate 500. Transistors for p-type device 326 and n-type device 324 for one embodiment may therefore not have diffusion bends, helping to fabricate transistors for p-type device 326 and n-type device 324 with diffusion widths substantially as intended and therefore with a ratio of transconductance substantially as intended.

Aligning diffusion regions for p-type devices 312 and 316 and aligning diffusion regions for p-type devices 322 and 326 for one embodiment may help reduce or avoid any imbalance in transconductance ratios between the current paths on each side of memory cell 300.

Example Memory Device

Figure 6:
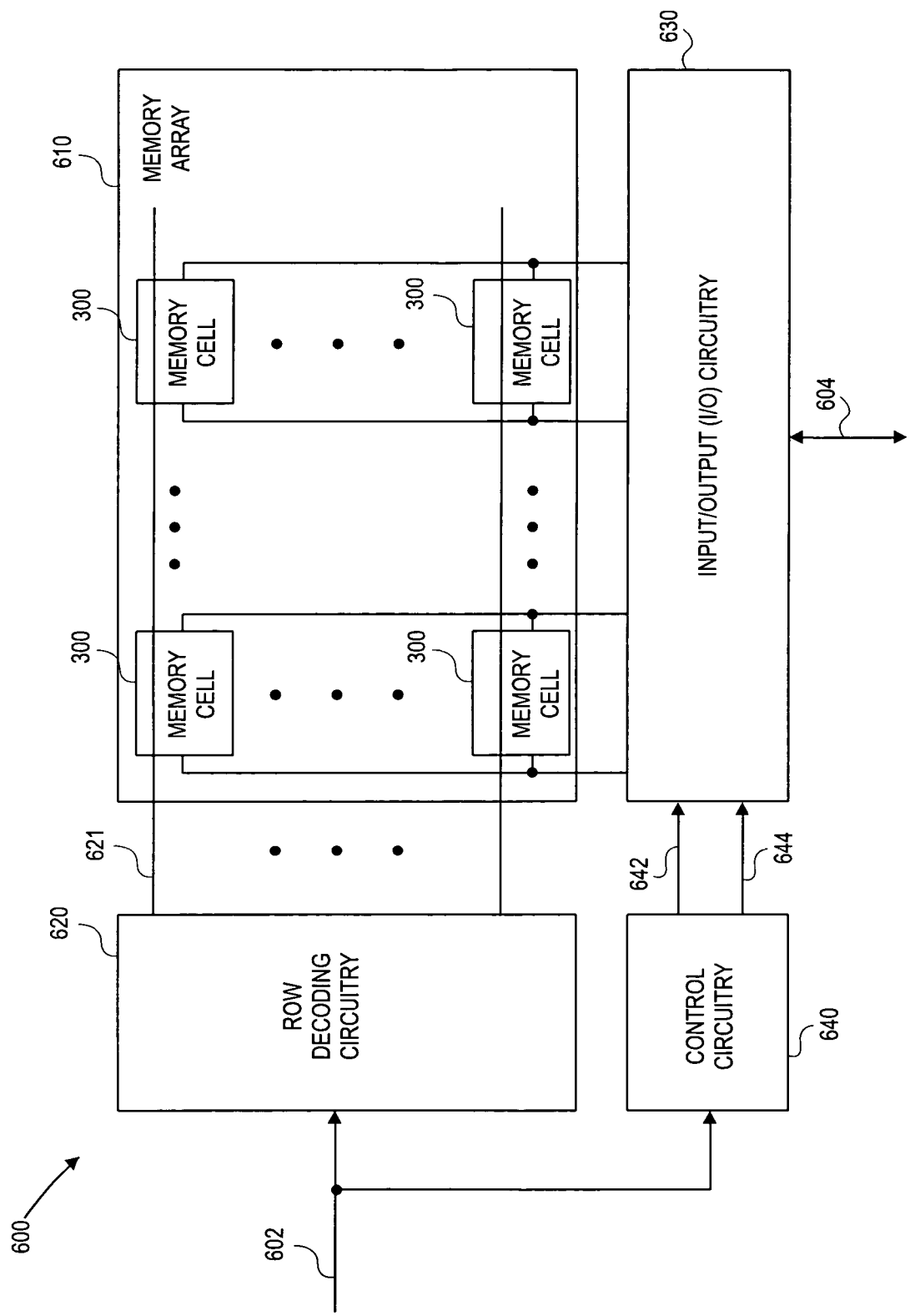
FIG. 6 illustrates, for one embodiment, a block diagram of an example memory device including a memory cell of FIG. 3.

Memory cell 300 for one embodiment may be used in any suitable memory device. Memory cell 300 for one embodiment, as illustrated in FIG. 6, may be used in a memory device 600. Memory device 600 for one embodiment may be a static random access memory (SRAM) memory device.

As illustrated in FIG. 6, memory device 600 for one embodiment may comprise a memory array 610, row decoding circuitry 620, input/output (I/O) circuitry 630, and control circuitry 640.

Memory array 610 may comprise multiple rows and multiple columns of memory cells, any suitable one or more of which may be a memory cell having a p-type pass device, such as memory cell 300 for example.

Row decoding circuitry 620 for one embodiment may be coupled to receive at least a portion of an address on address lines 602 and to generate a signal on a word line, such as a word line 621 for example, to select memory cells in a row of memory array 610 in response to the received address portion. For one embodiment, a word line may correspond to select line 330 of FIG. 3. Row decoding circuitry 620 for one embodiment may generate a relatively low voltage signal on a word line to activate p-type pass devices, such as p-type devices 316 and 326 of FIG. 3 for example, of memory cells in a row of memory array 610.

I/O circuitry 630 may comprise precharge circuitry, such as precharge circuitry 345 of FIG. 3 for example, coupled to precharge bit lines coupled to memory cells in columns of memory array 610. A single pair of complementary bit lines may be common to multiple memory cells in one column of memory array 610. I/O circuitry 630 for one embodiment may comprise one or more sense amplifiers. A sense amplifier may be coupled to sense complementary signals on a select bit line pair of multiple bit line pairs corresponding to multiple columns of memory array 610 and to output on one or more data lines 604 corresponding amplified complementary signals or an amplified signal representative of a binary value corresponding to the sensed complementary signals. I/O circuitry 630 for one embodiment may comprise one or more write drivers. A write driver may be coupled to receive a signal or complementary signals representative of a binary value on one or more data lines 604 and to assert corresponding complementary signals on a select bit line pair of multiple bit line pairs corresponding to multiple columns of memory array 610.

Control circuitry 640 for one embodiment may be coupled to generate a signal on a precharge control line 642 to activate precharge circuitry of I/O circuitry 630 to precharge one or more bit line pairs. Control circuitry 640 for one embodiment may be coupled to receive at least a portion of the address and to generate one or more signals on one or more column select lines 644 to select memory cells in one or more columns of memory array 610 in response to the received address portion. Control circuitry 640 for one embodiment may generate one or more signals on one or more column select lines 644 to control one or more multiplexers to couple one or more bit line pairs to one or more corresponding sense amplifiers and/or write drivers of I/O circuitry 630.

Example System

Memory cell 300 for one embodiment may be used in any suitable system. Memory cell 300 for one embodiment, as illustrated in FIG. 7, may be used in a system 700.

Figure 7:
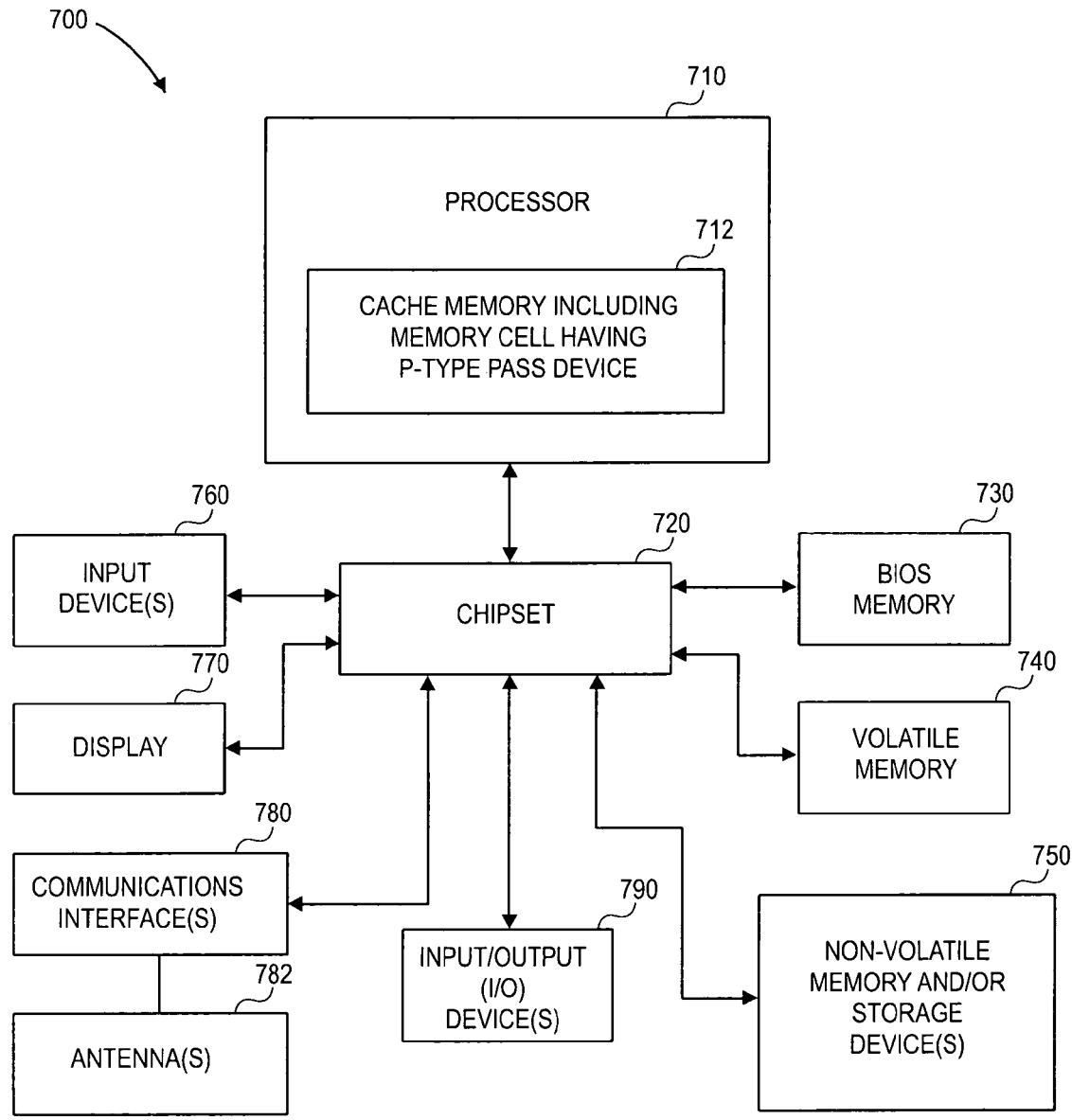
FIG. 7 illustrates, for one embodiment, a block diagram of an example system comprising a processor having a cache memory including a memory cell of FIG. 3.

As illustrated in FIG. 7, system 700 for one embodiment may comprise a processor 710 having a cache memory 712 including memory cells, any suitable one or more of which may be a memory cell having a p-type pass device, such as memory cell 300 for example. Cache memory 712 for one embodiment may comprise memory device 600 of FIG. 6. Although illustrated as a part of processor 710 for one embodiment, cache memory 712 for another embodiment may be separate from processor 710. System 700 for another embodiment may comprise multiple processors one or more of which may have cache memory similar to cache memory 712.

System 700 for one embodiment may also comprise a chipset 720 coupled to processor 710, a basic input/output system (BIOS) memory 730 coupled to chipset 720, volatile memory 740 coupled to chipset 720, non-volatile memory and/or storage device(s) 750 coupled to chipset 720, one or more input devices 760 coupled to chipset 720, a display 770 coupled to chipset 720, one or more communications interfaces 780 coupled to chipset 720, and/or one or more other input/output (I/O) devices 790 coupled to chipset 720.

Chipset 720 for one embodiment may comprise any suitable interface controllers to provide for any suitable communications link to processor 710 and/or to any suitable device or component in communication with chipset 720.

Chipset 720 for one embodiment may comprise a firmware controller to provide an interface to BIOS memory 730. BIOS memory 730 may be used to store any suitable system and/or video BIOS software for system 700. BIOS memory 730 may comprise any suitable non-volatile memory, such as a suitable flash memory for example. BIOS memory 730 for one embodiment may alternatively be included in chipset 720.

Chipset 720 for one embodiment may comprise one or more memory controllers to provide an interface to volatile memory 740. Volatile memory 740 may be used to load and store data and/or instructions, for example, for system 700. Volatile memory 740 may comprise any suitable volatile memory, such as suitable dynamic random access memory (DRAM) for example. Processor 710 for one embodiment may use cache memory 712 to store data and/or instructions stored or to be stored in volatile memory 740, for example, for faster access to such data and/or instructions.

Chipset 720 for one embodiment may comprise a graphics controller to provide an interface to display 770. Display 770 may comprise any suitable display, such as a cathode ray tube (CRT) or a liquid crystal display (LCD) for example. The graphics controller for one embodiment may alternatively be external to chipset 720.

Chipset 720 for one embodiment may comprise one or more input/output (I/O) controllers to provide an interface to non-volatile memory and/or storage device(s) 750, input device(s) 760, communications interface(s) 780, and/or I/O devices 790.

Non-volatile memory and/or storage device(s) 750 may be used to store data and/or instructions, for example. Non-volatile memory and/or storage device(s) 750 may comprise any suitable non-volatile memory, such as flash memory for example, and/or may comprise any suitable non-volatile storage device(s), such as one or more hard disk drives (HDDs), one or more compact disc (CD) drives, and/or one or more digital versatile disc (DVD) drives for example.

Input device(s) 760 may comprise any suitable input device(s), such as a keyboard, a mouse, and/or any other suitable cursor control device.

Communications interface(s) 780 may provide an interface for system 700 to communicate over one or more networks and/or with any other suitable device. Communications interface(s) 780 may comprise any suitable hardware and/or firmware. Communications interface(s) 780 for one embodiment may comprise, for example, a network adapter, a wireless network adapter, a telephone modem, and/or a wireless modem. For wireless communications, communications interface(s) 780 for one embodiment may use one or more antennas 782.

I/O device(s) 790 may comprise any suitable I/O device(s) such as, for example, an audio device to help convert sound into corresponding digital signals and/or to help convert digital signals into corresponding sound, a camera, a camcorder, a printer, and/or a scanner.

Although described as residing in chipset 720, one or more controllers of chipset 720 may be integrated with processor 710, allowing processor 710 to communicate with one or more devices or components directly. As one example, one or more memory controllers for one embodi- In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. An apparatus comprising:
   a first p-type device coupled between a cell voltage node and a storage node;
   an n-type device coupled between the storage node and a reference voltage node; and
   a second p-type device to couple the storage node to a bit line in response to a signal on a select line, wherein at least one side of at least first and second diffusion regions in a substrate to form the first p-type device and the second p-type device are substantially aligned, wherein the first diffusion region is not shared between the first p-type device and the second p-type device, and wherein the second diffusion region is not shared between the first p-type device and the second p-type device.

2. The apparatus of claim 1, wherein the first and second p-type devices have substantially the same width.

3. The apparatus of claim 1, wherein one side along a length of at least the first and second diffusion regions in the substrate are substantially aligned.

4. The apparatus of claim 1, wherein widths of at least the first and second diffusion regions in the substrate are substantially aligned.

5. The apparatus of claim 1, comprising:
   a third p-type device coupled between a cell voltage node and another storage node;
   another n-type device coupled between the other storage node and a reference voltage node; and
   a fourth p-type device to couple the other storage node to another bit line in response to a signal on the select line.

6. The apparatus of claim 5, wherein widths of at least the first and second diffusion regions in the substrate are substantially aligned and widths of diffusion regions in the substrate to form the third p-type device and the fourth p-type device are substantially aligned.

7. The apparatus of claim 1, comprising circuitry to precharge the bit line using a supply voltage that is substantially the same as that at the cell voltage node.

8. An apparatus comprising:
   a first inverter to output a first signal at a first storage node in response to a second signal at a second storage node, wherein the first inverter has a first p-channel transistor;
   a second inverter to output the second signal at the second storage node in response to the first signal at the first storage node, wherein the second inverter has a second p-channel transistor;
   a third p-channel transistor coupled between the first storage node and a first bit line, the third p-channel transistor having a gate coupled to a word line, wherein at least one side of at least first and second p-type diffusion regions in a substrate to form the first p-channel transistor and the third p-channel transistor are substantially aligned, wherein the first p-type diffusion region is not shared between the first p-channel transistor and the third p-channel transistor, and wherein the second p-type diffusion region is not shared between the first p-channel transistor and the third p-channel transistor; and
   a fourth p-channel transistor coupled between the second storage node and a second bit line, the fourth p-channel transistor having a gate coupled to the word line.

9. The apparatus of claim 8, wherein the first and third p-channel transistors have substantially the same width.

10. The apparatus of claim 8, wherein one side along a length of at least the first and second p-type diffusion regions in the substrate are substantially aligned.

11. The apparatus of claim 8, wherein widths of at least the first and second p-type diffusion regions in the substrate are substantially aligned.

12. The apparatus of claim 11, wherein widths of p-type diffusion regions in the substrate to form the second p-channel transistor and the fourth p-channel transistor are substantially aligned.

13. The apparatus of claim 8, wherein the first inverter has a first n-channel transistor and wherein the second inverter has a second n-channel transistor.

14. The apparatus of claim 8, comprising circuitry to precharge the first and second bit lines using a supply voltage that is substantially the same as that used for the first and second inverters.

15. A method comprising:
   activating a first p-channel transistor to generate a signal at a first storage node in response to a signal at a second storage node;
   activating an n-channel transistor to generate a signal at the second storage node in response to a signal at the first storage node;
   activating a second p-channel transistor to couple the first storage node to a first bit line, wherein at least one side of at least first and second p-type diffusion regions in a substrate to form the first p-channel transistor and the second p-channel transistor are substantially aligned, wherein the first p-type diffusion region is not shared between the first p-channel transistor and the second p-channel transistor, and wherein the second p-type diffusion region is not shared between the first p-channel transistor and the second p-channel transistor; and
   activating a third p-channel transistor to couple the second storage node to a second bit line.

16. The method of claim 15, wherein widths of at least the first and second p-type diffusion regions in the substrate are substantially aligned.

17. The method of claim 15, comprising:
   precharging the first and second bit lines using a supply voltage that is substantially the same as that to generate a signal at the first storage node in response to activation of the first p-channel transistor.

18. A system comprising:
   volatile memory; and
   a processor having a cache memory, the cache memory including memory cells, wherein one or more memory cells include:
      a first p-type device coupled between a cell voltage node and a storage node;
      an n-type device coupled between the storage node and a reference voltage node; and
      a second p-type device to couple the storage node to a bit line in response to a signal on a word line, wherein at least one side of at least first and second diffusion regions in a substrate to form the first p-type device and the second p-type device are substantially aligned, wherein the first diffusion region is not shared between the first p-type device and the second p-type device, and wherein the second diffusion region is not shared between the first p-type device and the second p-type device.

19. The system of claim 18, wherein widths of at least the first and second diffusion regions in the substrate are substantially aligned.

20. The system of claim 18, comprising circuitry to precharge the bit line using a supply voltage that is substantially the same as that at the cell voltage node.

* * * * *